United States Patent
Kao et al.

(10) Patent No.: US 7,759,980 B2
(45) Date of Patent: Jul. 20, 2010

(54) CIRCULAR EDGE DETECTOR FOR MEASURING TIMING OF DATA SIGNALS

(75) Inventors: Jerry C. Kao, Ann Arbor, MI (US); Jente B. Kuang, Austin, TX (US); Alan J. Drake, Round Rock, TX (US); Gary D. Carpenter, Austin, TX (US); Fadi H. Gebara, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 665 days.

(21) Appl. No.: 11/563,888

(22) Filed: Nov. 28, 2006

(65) Prior Publication Data

US 2008/0122490 A1     May 29, 2008

(51) Int. Cl.
*H03K 5/22* (2006.01)
(52) U.S. Cl. .................. 327/24; 326/38; 375/354; 710/54
(58) Field of Classification Search .................. 327/24; 375/354; 710/54; 326/38
See application file for complete search history.

(56) References Cited

U.S. PATENT DOCUMENTS

| | | | | |
|---|---|---|---|---|
| 4,975,640 A | * | 12/1990 | Lipp | 714/734 |
| 5,592,105 A | * | 1/1997 | Cheung et al. | 326/38 |
| 6,178,472 B1 | * | 1/2001 | Carpenter et al. | 710/54 |
| 2008/0092001 A1 | * | 4/2008 | Kodavalla et al. | 714/731 |

* cited by examiner

*Primary Examiner*—Lincoln Donovan
*Assistant Examiner*—John W Poos
(74) *Attorney, Agent, or Firm*—Garg Law Firm, PLLC; Rakesh Garg; Libby Z. Toub

(57) ABSTRACT

A circular edge detector on an integrated circuit including a plurality of edge detector cells, each of the plurality of edge detector cells having an input select block operable to receive a data signal and a previous cell signal and to generate a present cell signal, and a state capture block operably connected to receive the present cell signal. The present cell signal of each of the plurality of edge detector cells is provided to a next of the plurality of edge detector cells as the previous cell signal for the next of the plurality of edge detector cells, and the present cell signal from a last edge detector cell is provided to a first edge detector cell as the previous cell signal for the first edge detector cell.

11 Claims, 10 Drawing Sheets

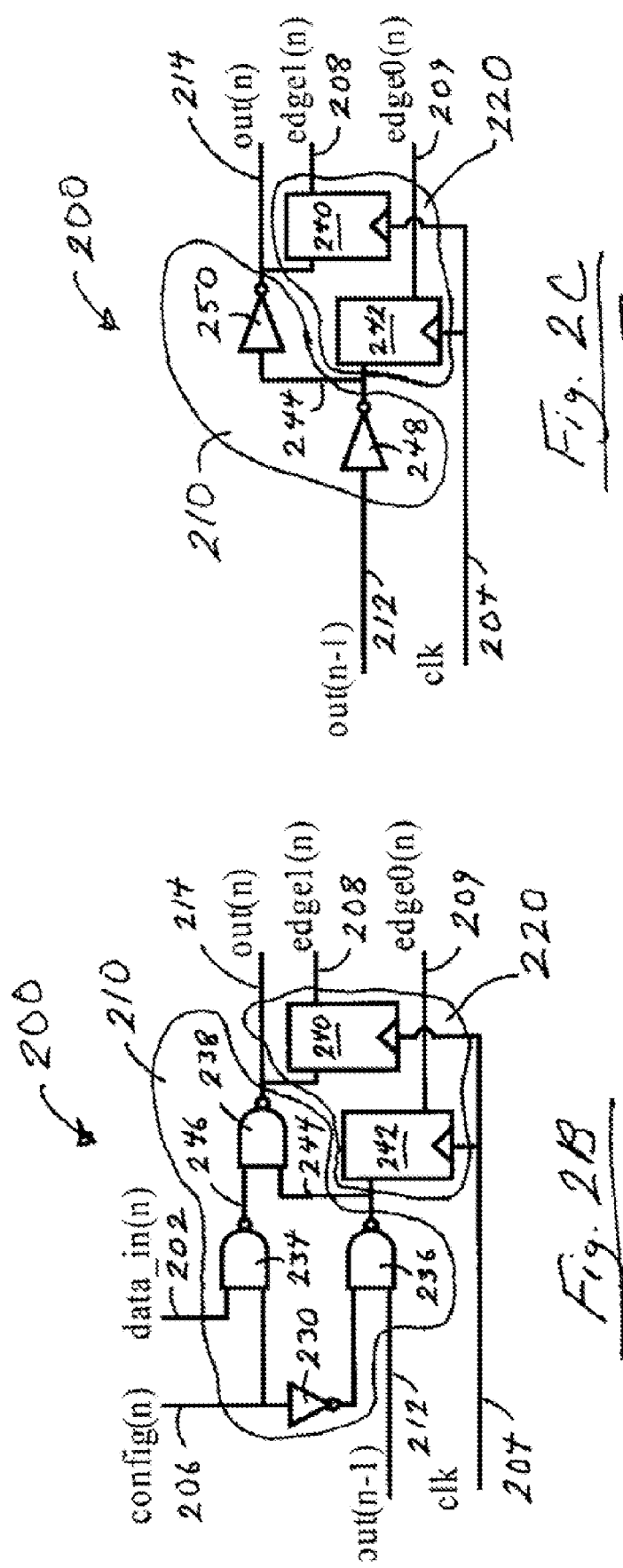

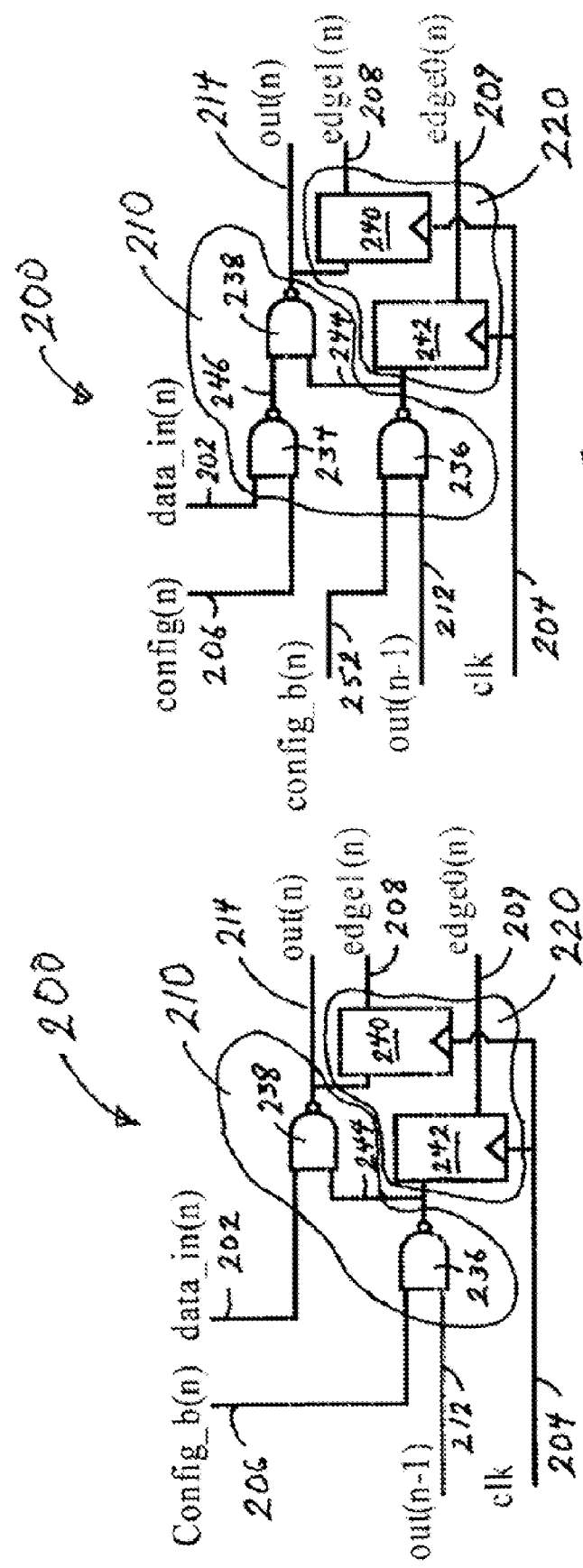

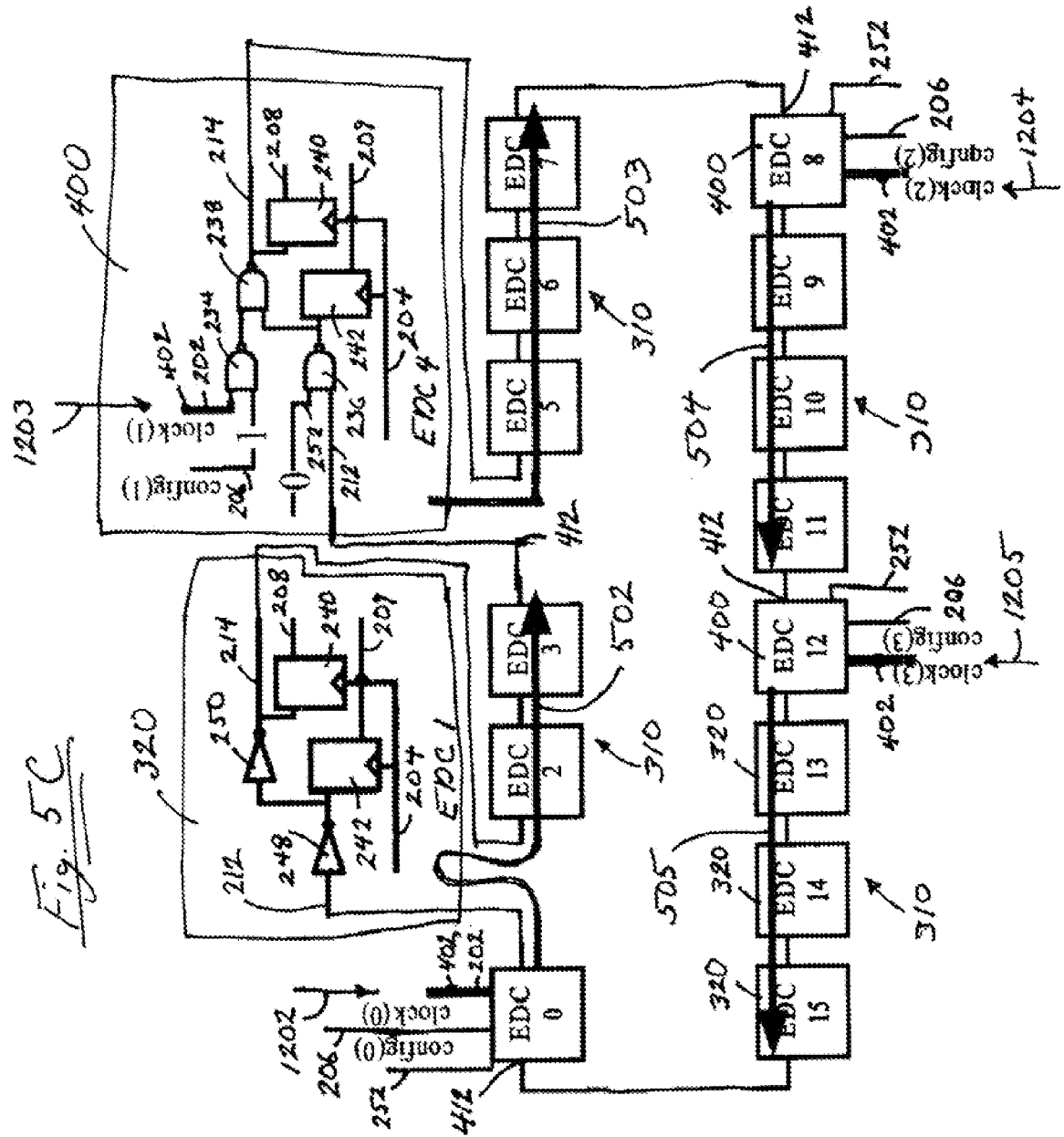

CIRCULAR EDGE DETECTOR FOR MEASURING TIMING OF DATA SIGNALS

TECHNICAL FIELD

The technical field of this disclosure is integrated circuit (IC) design systems, particularly, clock and/or data signal edge detectors for characterizing timing uncertainties in ICs.

BACKGROUND OF THE INVENTION

Integrated circuits (ICs), such as very large scale integration (VLSI) chips like microprocessors, depend on precise timing to coordinate activity throughout the IC. Typically, an internal clock is distributed throughout the chip to synchronously capture incoming data at the register latches and launch data from register latches. While the edge of the internal clock should arrive at all the register latches simultaneously to trigger the register latches simultaneously, differences in chips can cause the edge of the internal clock to arrive at different register latches at different times and create timing uncertainties.

Timing uncertainties can arise from data propagation variations and/or clock arrival variations. Data propagation variations include latching invalid data when the data has not settled at the register latch. Clock arrival variations include clock frequency fluctuations (jitter) and/or register-to-register clock edge arrival variations (skew). Timing uncertainties can be caused by such things as ambient chip conditions (e.g., local temperature induced circuit variations or circuit heat sensitivities), power supply noise, and chip process variations.

IC designs allow for timing uncertainties by building design margin into the timing sequences. A conservatism factor is applied to the expected timing to account for the timing uncertainties, with a larger conservatism factor required when larger timing uncertainties. Characterization of the timing uncertainties can avoid building unnecessary margin into the timing sequences.

Present systems for timing uncertainty measurement employ a string of latches to measure the timing uncertainty for a single data signal, such as a single clock or single data string. The edge of the data signal passes through the string of latches and triggers the latches. The timing of the edge can be determined from the state of the latches. It is often desirable to measure timing uncertainties for a number of data signals individually or simultaneously. Unfortunately, present systems require one dedicated string of latches for each data signal to be tested or a multiplexer to switch the data signal into a latch string. Use of multiple dedicated latch strings to measure multiple data signals requires use of valuable IC area and increases the cost of ICs. Use of a multiplexer reduces measurement sensitivity, requiring more margin to be built into the timing sequences and reducing performance. The problems of the present systems become worse as the number of data signals to be measured increases.

Present systems for timing uncertainty measurement are also inflexible. The length of the sampling window, i.e., the number of latches in the latch strings, is fixed. The timing uncertainty measurement uses all the latches, regardless of the length of the sampling window required. In addition, the sampling window is of fixed length and cannot be shared as several shorter sampling windows to measure a number of data signals simultaneously.

It would be desirable to have a circular edge detector that would overcome the above disadvantages.

SUMMARY OF THE INVENTION

The circular edge detector of the present invention provides flexible measurement of the timing of data signals on an integrated circuit. A circular data path through the circular edge detector can be used as one large sampling window or can be divided into a number of smaller sampling windows. The smaller sampling windows can be used to measure a number of data signals simultaneously. The lengths of the sampling windows can be tailored for the particular data signal to be measured. Data signals can be connected to the circular data path at various points along the circular data path.

One aspect of the present invention provides a circular edge detector on an integrated circuit including a plurality of edge detector cells, each of the plurality of edge detector cells having an input select block operable to receive a data signal and a previous cell signal and to generate a present cell signal, and a state capture block operably connected to receive the present cell signal. The present cell signal of each of the plurality of edge detector cells is provided to a next of the plurality of edge detector cells as the previous cell signal for the next of the plurality of edge detector cells, and the present cell signal from a last edge detector cell is provided to a first edge detector cell as the previous cell signal for the first edge detector cell.

Another aspect of the present invention provides a circular edge detector on an integrated circuit including lead edge detector cells (EDCs), each of the lead edge detector cells having an EDC data input, an EDC configuration input, an EDC input, and an EDC output; edge detector series (EDSs), each of the edge detector series having an EDS input and an EDS output; and a first edge detector series (EDS) having a first EDS data input and a first EDS data output. The EDC output of each of the lead edge detector cells is operably connected to a next of the edge detector series at the EDS input of the next of the edge detector series; the EDS output of each of the edge detector series is operably connected to a next of the lead edge detector cells at the EDC input of the next of the lead edge detector cells; and the EDS output of the last of a last edge detector series is operably connected to the EDC input of a first lead edge detector cell.

Another aspect of the present invention provides an edge detection method with a variable length sampling window on an integrated circuit including providing a circular edge detector having edge detector cells (EDCs), an EDC data output of each of the edge detector cells being operably connected to an EDC data input of another of the edge detector cells to form a circular data path through the circular edge detector; and configuring one of the edge detector cells to receive a data signal and to block the EDC data input through the one of the edge detector cells.

Another aspect of the present invention provides a circular edge detector on an integrated circuit including input select blocks, an input select block output of each of the input select blocks being operably connected to an input select block input of another of the input select blocks to form a circular data path; and state capture blocks, operably connected to the input select block output of each of the input select blocks. At least one of the input select blocks is configurable to divide the circular data path into a sampling window.

The foregoing and other features and advantages of the invention will become further apparent from the following detailed description of the presently preferred embodiments, read in conjunction with the accompanying drawings. The detailed description and drawings are merely illustrative of the invention, rather than limiting the scope of the invention being defined by the appended claims and equivalents thereof.

BRIEF DESCRIPTION OF THE DRAWINGS

FIGS. 2A-2E are schematic diagrams of edge detector cells for a circular edge detector made in accordance with the present invention;

FIGS. 5A-5C are block diagrams of embodiments of circular edge detectors made in accordance with the present invention.

DESCRIPTION OF PRESENTLY PREFERRED EMBODIMENTS

Figure 1:
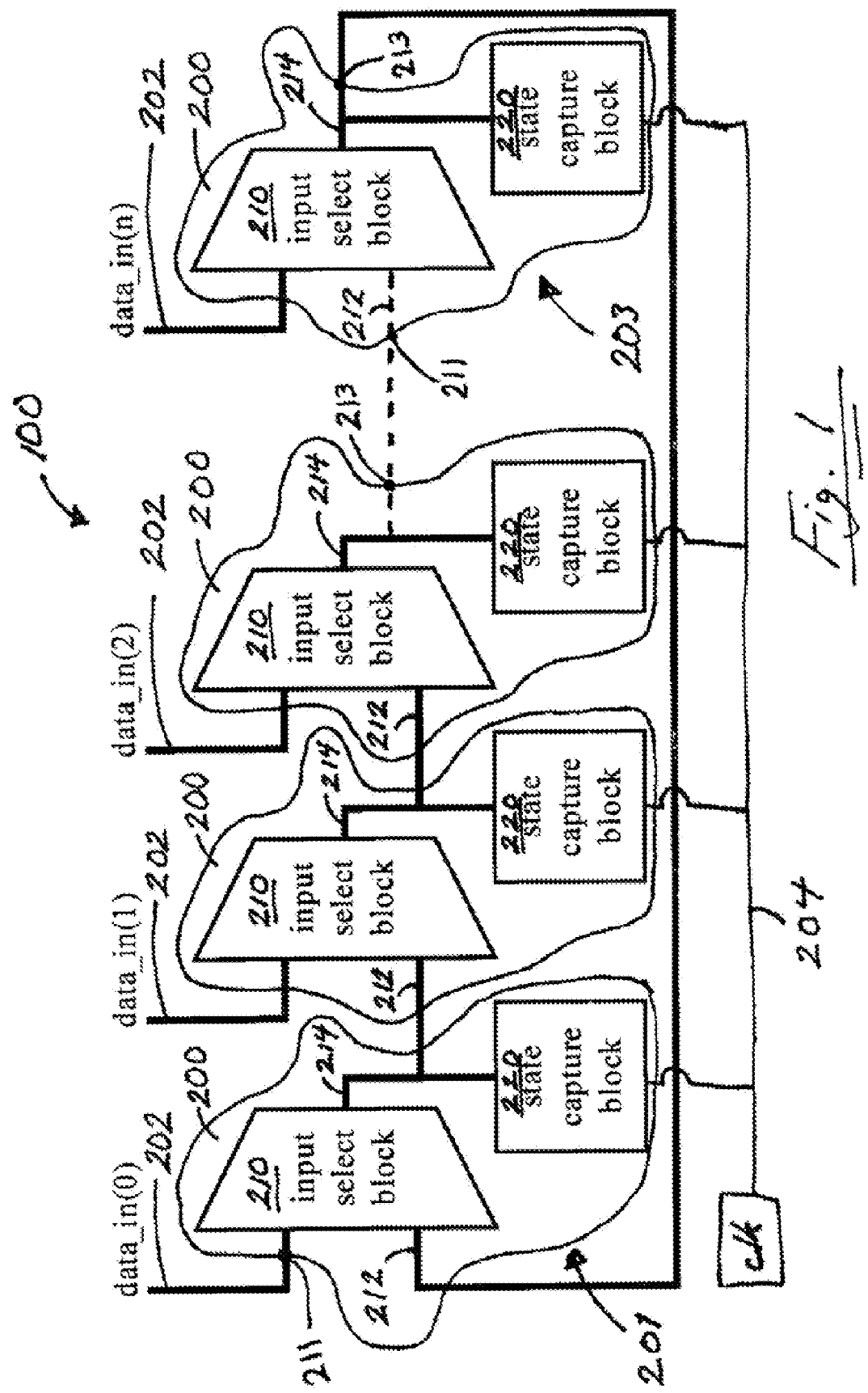
FIG. 1 is a block diagram of a circular edge detector made in accordance with the present invention.

FIG. 1 is a block diagram of a circular edge detector made in accordance with the present invention. The circular edge detector monitors the edge of one or more data signals to characterize the absolute and/or relative timing of the data signal or signals.

The circular edge detector 100 includes a number of edge detector cells 200 connected to form a circular data path through the circular edge detector 100. Each of the edge detector cells 200 has an input select block 210 and a state capture block 220. The input select block 210 is operable to receive a data signal 202 (data_in) and a previous cell signal 212 and to generate a present cell signal 214. The state capture block 220 is operably connected to receive the present cell signal 214. The state capture blocks 220 are also responsive to a clock signal 204 to trigger the capture the state of the present cell signals 214 at predetermined times. The present cell signal 214 of each of the edge detector cells 200 is provided to a next edge detector cell 200 as the previous cell signal 212 for the next edge detector cell 200. The present cell signal 214 from a last edge detector cell 203 is provided to a first edge detector cell 201 as the previous cell signal 212 for the first edge detector cell 201 to complete the circular data path through the circular edge detector 100. Those skilled in the art will appreciate that the designation of first and last edge detector cells is for illustration, since any adjacent edge detector cells in the circular data path can be designated the first and last edge detector cells. The circular data path proceeds through all of the input select blocks 210, following a path between the connections receiving the data signal 202 and generating the present cell signal 214 for each edge detector cell 200 until the circular data path returns to the first edge detector cell 200.

The input select block 210 is operable to receive the data signal 202 and the previous cell signal 212 and to generate the present cell signal 214. The data signal 202 is received at an input select block input 211 and the present cell signal 214 is dispatched from an input select block output 213 for each of the input select blocks 210. The input select block output 213 of each of the input select blocks 210 is operably connected to an input select block input 211 of another of the input select blocks 210 to form a circular data path. At least one of the input select blocks 210 is configurable to divide the circular data path into a sampling window. In one embodiment, at least two of the input select blocks 210 are configurable to divide the circular data path into a first sampling window and a second sampling window. The first sampling window and the second sampling window can be of different lengths. Those skilled in the art will appreciate that the circular data path can be divided into a number of different sampling windows of equal or different lengths as desired for a particular application.

The data signal 202 can be any signal on an integrated circuit for which edge detection is desired, such as a clock or data. In one embodiment, all of the input select blocks 210 are operably connected to receive a data signal 202. In another embodiment, some of the input select blocks 210 are operably connected to receive a data signal 202. In one embodiment, some of the edge detector cells 200 can receive clocks as their data signal 202 and others of the edge detector cells 200 can receive data. Different data signals 202 can be provided to different edge detector cells 200.

The data signals 202 can be provided to some of the edge detector cells 200 and not provided to other edge detector cells 200. The edge detector cells 200 receiving the data signals 202 can be separated by a desired number of edge detector cells 200 not receiving the data signals 202, e.g., every third or fourth edge detector cell 200 can receive a data signal 202 and the edge detector cells 200 between them not receive a data signal 202. The previous cell signal 212 is the present cell signal 214 from the upstream adjacent edge detector cell 200.

The state capture block 220 is operably connected to receive the present cell signal 214 from the input select block 210 at the input select block output 213 of each of the input select blocks 210. The state capture blocks 220 are also responsive to a clock signal 204 to capture the state of the present cell signals 214 at predetermined times. The states held in the state capture blocks 220 of the sequential edge detector cells 200 indicate the arrival time of the data signal 202. The clock signal 204 can have a frequency selected to provide the initial edge position for edge detection measurement. The frequency can be selected by adjusting the global clock frequency by changing the control bits to a Phase Locked Loop (PLL).

In operation, an input select block 210 for at least one of the edge detector cells 200 is configured to pass the data signal 202 and to block the previous cell signal 212, so that the data signal 202 becomes the present cell signal 214 for the configured edge detector cell 200. The present cell signal 214 from the configured edge detector cell 200 passes through sequential edge detector cells 200 as long as a downstream edge detector cell 200 is not configured to block the previous cell signal 212. When only one of the edge detector cells 200 in the circular edge detector 100 is configured to block the previous cell signal 212, the data signal 202 can follow the circular data path around and toward the configured edge detector cell 200, where the data signal 202 can be blocked. The present cell signal 214 can be captured at the state capture block 220 of each of the edge detector cells 200 as directed by the clock signal 204. The timing of the data signal 202 can be determined from the state of the sequential state capture blocks 220, indicating the edge of the data signal 202.

In one example of operation, the circular edge detector 100 can be used to measure and adjust for timing uncertainty caused by process variations, such as voltage and temperature variations. The circular edge detector 100 is first initialized so that the initial edge of the data signal 202 under test is captured in a state capture block 220 in the center of the circular data path through the circular edge detector 100. The data signal 202 under test can be tested repeatedly to monitor the movement of the initial edge from the state capture block 220 in the center of the circular data path in response to process variations. The movement or lack of movement of the initial edge can be used to assure that the design margin is adequate and to adjust the operating parameters, such as supply voltages, frequency, and temperature.

Those skilled in the art will appreciate that the number of edge detector cells 200 can be selected as desired for a particular application. A larger number of edge detector cells 200 can be used when the circular edge detector 100 is used to sample more than one data signal 202 and/or when a large sampling window is desired.

FIGS. 2A-2E, in which like elements share like reference numbers with FIG. 1 and with each other, are schematic diagrams of edge detector cells for a circular edge detector made in accordance with the present invention. FIGS. 2A-2E are schematic diagrams of a basic edge detector cell, a tied configuration edge detector cell, an unconfigurable edge detector cell, a single configuration edge detector cell, and a dual configuration edge detector cell, respectively.

Figure 2A:
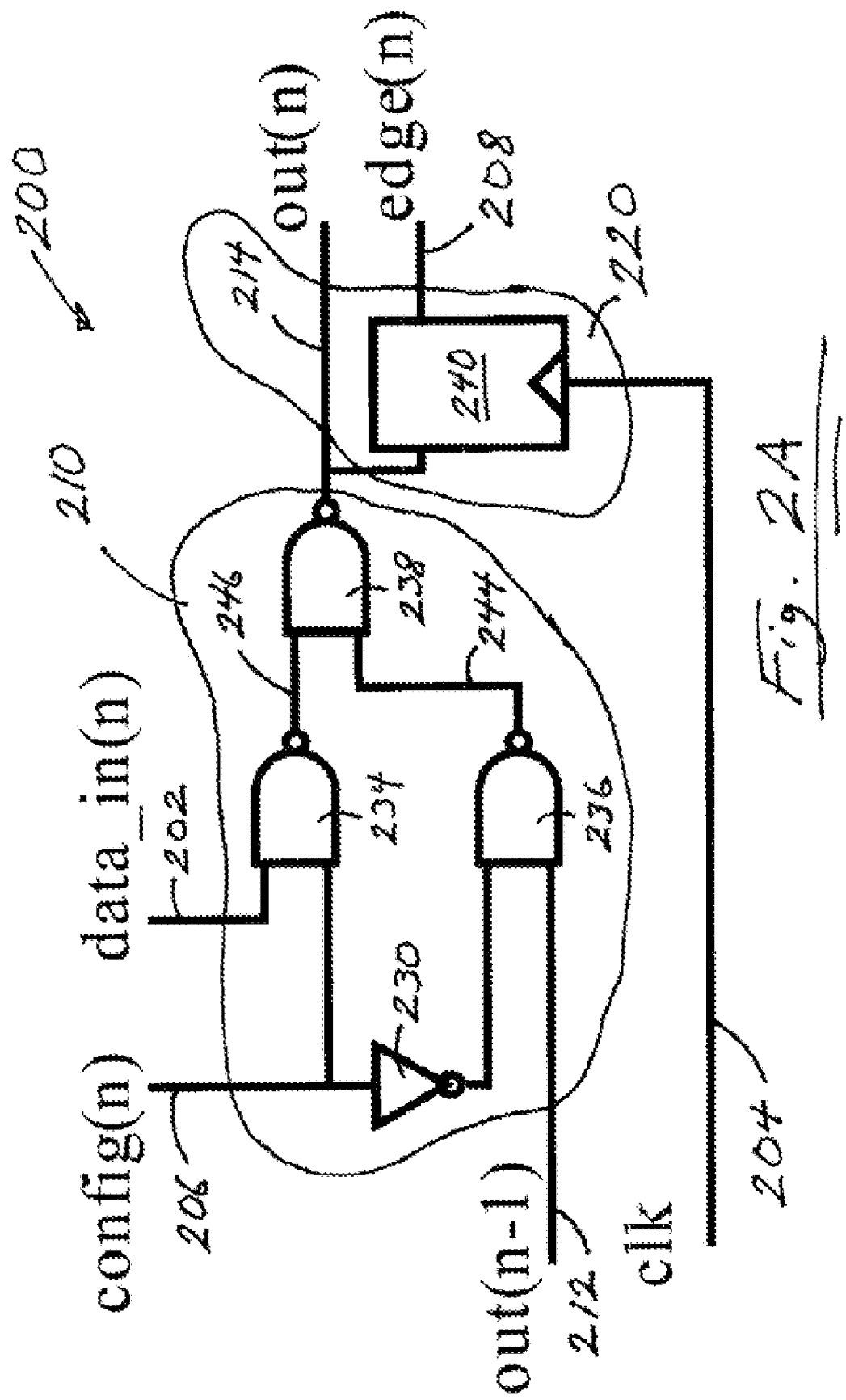

Referring to FIG. 2A, which illustrates a basic edge detector cell, the input select block 210 includes an inverter 230, and NAND gates 234, 236, 238. The state capture block 220 includes flip-flop 240. A basic edge detector cell as defined herein uses a single flip-flop in the state capture block. In this embodiment, a configuration signal 206 (config) configures the edge detector cell 200 to pass one of the data signal 202 (data_in) and the previous cell signal 212 (out(n−1)) and block the other of the data signal 202 and the previous cell signal 212. When the configuration signal 206 is high, one of the inputs to the NAND gate 234 is high, so an intermediate data signal 246 from the NAND gate 234 is the inverse of the data signal 202. The input to the NAND gate 236 from the inverter 230 is low, so an intermediate cell signal 244 from the NAND gate 236 is high regardless of the state of the previous cell signal 212. The present cell signal 214 (out(n)), which is the output of the NAND gate 238, follows the data signal 202. When the configuration signal 206 is low, the data signal 202 is blocked and the present cell signal 214 follows the previous cell signal 212. An edge signal 208 (edge) from the flip-flop 240 follows the state of the present cell signal 214 when clocked by the clock signal 204 (clk). The edge signal 208 from sequential edge detector cells 200 can be read to determine the timing of a data signal.

Referring to FIG. 2B, which illustrates a tied configuration edge detector cell, the input select block 210 in this example is the same as the input select block 210 of FIG. 2A, but the state capture block 220 includes a second flip-flop 242. The second flip-flop 242 improves resolution for measuring the timing of a previous cell signal 212, since only one NAND gate 236 processes the previous cell signal 212 to generate the intermediate cell signal 244 provided to the flip-flop 242. A tied configuration edge detector cell as defined herein uses a single configuration signal to select between the data signal and the previous cell signal in the input select block. The flip-flop 242 generates an edge signal 209 (edge0) that is the inverse of the edge signal 208 (edge1). The flip-flops 240, 242 are triggered by the clock signal 204. One advantage of having two flip-flops 240, 242 in the state capture block 220 is that the delay element between any two latches is one NAND gate. This provides a finer resolution than having a more complex input select block 210.

Referring to FIG. 2C, which illustrates an unconfigurable edge detector cell, the state capture block 220 in this example is the same as the state capture block 220 of FIG. 2B, but the input select block 210 does not include connections for receiving a data signal or a configuration signal. An unconfigurable edge detector cell as defined herein is not operable to receive a configuration signal or a data signal. An unconfigurable edge detector cell can be used in an edge detector series which receives the previous cell signal 212 and generates the present cell signal 214, without needing to receive data or to be configurable. The unconfigurable edge detector cell reduces the number of gates required. The input select block 210 includes inverters 248, 250. The inverter 248 inverts the previous cell signal 212 to generate the intermediate cell signal 244. The inverter 250 inverts the intermediate cell signal 244 to generate the present cell signal 214. The flip-flops 240, 242 are triggered by the clock signal 204 to capture the present cell signal 214 and the intermediate cell signal 244, respectively. The delay on inverters 248, 250 can be sized such that the delay is uniform between all different types of delay elements in different edge detector cells 200 to achieve a uniform resolution.

Referring to FIG. 2D, which illustrates a single configuration edge detector cell, the state capture block 220 in this example is the same as the state capture block 220 of FIG. 2B, but the input select block 210 includes fewer gates. A single configuration edge detector cell as defined herein uses a single configuration signal to process one of the data signal and the previous cell signal in the input select block. The configuration signal 206 (config_b) and previous cell signal 212 are inputs to the NAND gate 236 to generate the intermediate cell signal 244, and the data signal 202 and intermediate cell signal 244 are inputs to the NAND gate 238 to generate the present cell signal 214. In this embodiment, the data signal 202 is designed to be high in its normal state, so that the present cell signal 214 is a function of the previous cell signal 212. When the data signal 202 goes low, the present cell signal 214 is a function of the data signal 202, and the configuration signal 206 is taken low to block the previous cell signal 212.

Referring to FIG. 2E, which illustrates a dual configuration edge detector cell, the state capture block 220 in this example is the same as the state capture block 220 of FIG. 2B, but the input select block 210 receives an additional configuration signal 252 (config_b) and requires one less inverter. A dual configuration edge detector cell as defined herein uses two separate configuration signals to process the data signal and the previous cell signal in the input select block. The configuration signals 206, 252 can be set independently of each other to pass or block the data signal 202 and the previous cell signal 212. The configuration signal 206 (config) and the data signal 202 are inputs to the NAND gate 234 to generate the intermediate data signal 246, and the previous cell signal 212 and configuration signal 252 are inputs to the NAND gate 236 to generate the intermediate cell signal 244.

Those skilled in the art will appreciate that the logic for the edge detector cells shown in FIGS. 2A-2E is not limited to those examples illustrated. The edge detector cells can use any number and/or combination of logic gates as desired for a particular application as long as the edge detector cell is logically equivalent.

Figure 3:
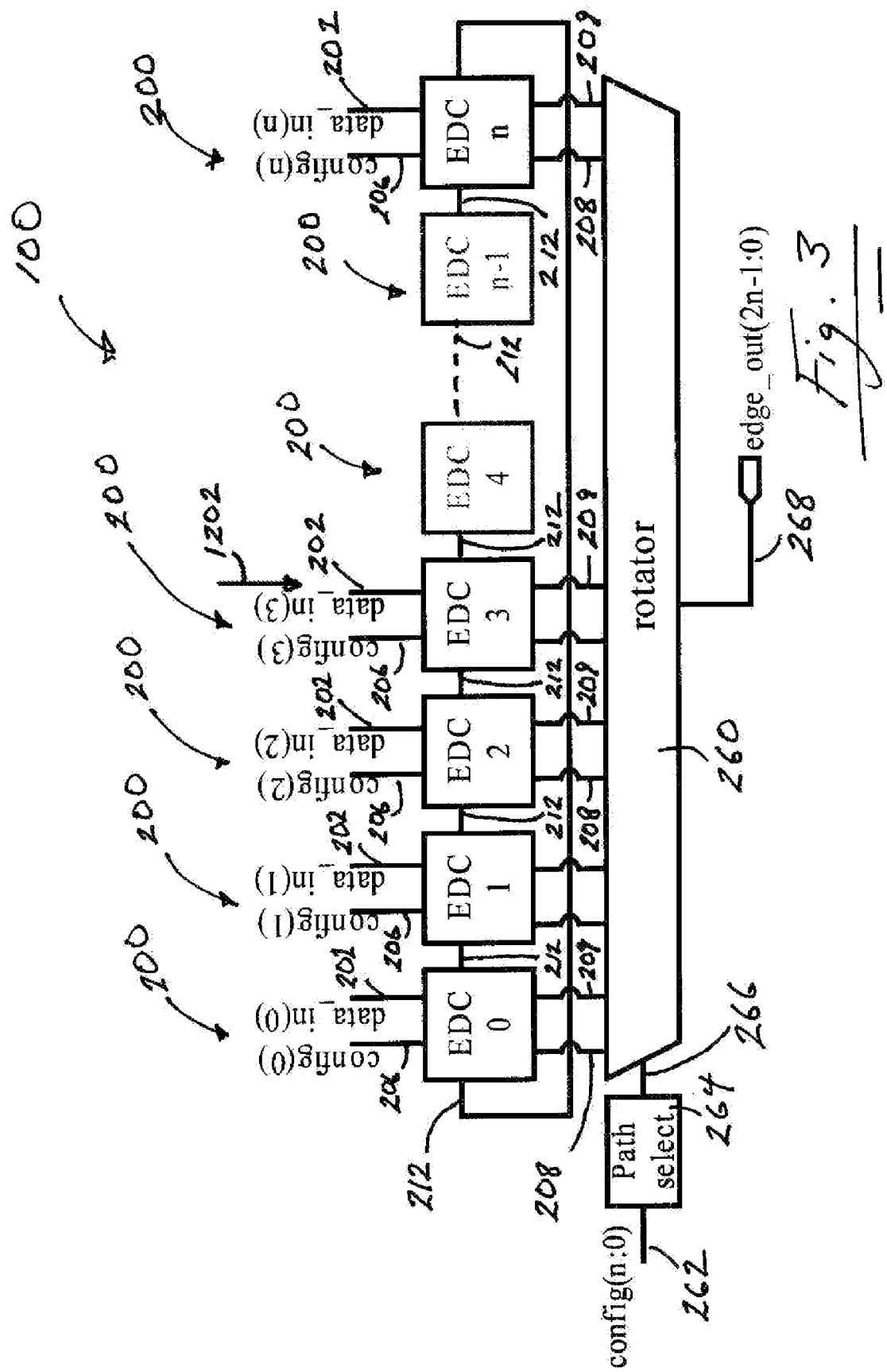
FIG. 3 is a block diagram of a circular edge detector with a rotator for a circular edge detector made in accordance with the present invention.

FIG. 3, in which like elements share like reference numbers with FIGS. 1 and 2A-2E, is a block diagram of a circular edge detector with a rotator for a circular edge detector made in accordance with the present invention. Any one of the edge detector cells with connections for a data signal can receive a data signal, so the edge signal at the first edge detector cell is not necessarily the edge signal first captured by the circular edge detector. A rotator can be used to realign the edge signals from each of the edge detector cells so that the edge signal first captured by the circular edge detector is read first.

Referring to FIG. 3, the circular edge detector 100 includes n edge detector cells 200 operably connected to form a circular data path through the circular edge detector 100. Each of the edge detector cells 200 receives a previous cell signal 212 from the upstream edge detector cell 200. In this example, some but not all of the edge detector cells 200 have connections for receiving a data signal 202 and a configuration signal 206, and all of the edge detector cells 200 have connections for reading out a first edge signal 208 and a second edge signal 209. The edge signals 208, 209 are passed to a rotator 260. A configuration start signal 262 indicating that the Nth edge detector cell 200 receives a data signal is provided to a path select block 264, which generates a path select signal 266 in response to the configuration start signal 262. The rotator 260 begins the read out of the edge signals 208, 209 at the 2N position in the rotator 260 and provides the edge values as information in an edge read out signal 268.

In one example of operation of the rotator 260, the third edge detector cell (EDC3) receives data signal 1202. The configuration signal 206 for EDC3 is set to block the previous cell signal 212 from EDC2 upstream. Once the state of the data signal 1202 has been captured in the edge detector cells 200, the rotator 260 is used to read the edge signals 208, 209. The configuration start signal 262 informs the path select block 264 that EDC3 receives the data signal 1202, i.e., that the N value is 3, and the path select block 264 generates a path select signal 266 directing the rotator 260 to start reading at the 2N position, i.e., the first edge signal 208 of EDC3. The rotator 260 can continue reading sequentially through EDC4, EDCn−1, EDCn, and EDC1 until reaching the second edge signal 208 of EDC2, which is the final edge signal.

Figure 4:
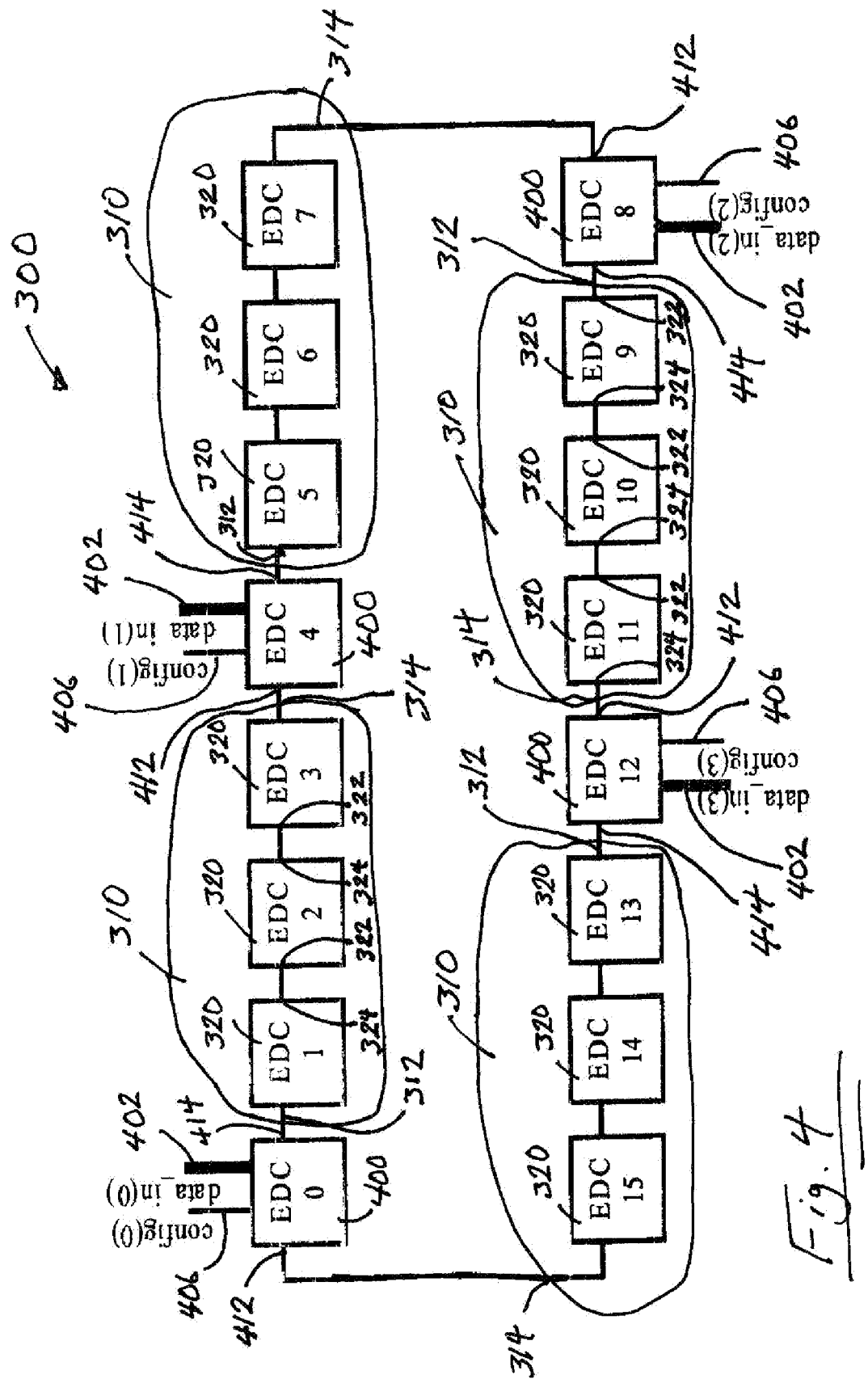
FIG. 4 is a block diagram of another embodiment of a circular edge detector made in accordance with the present invention.

FIG. 4 is a block diagram of another embodiment of a circular edge detector made in accordance with the present invention. The circular edge detector alternates between edge detector cells and edge detector series.

The circular edge detector 300 can be configured to use the whole length of the circular data path and provide a large sampling window or can be divided into shorter lengths and a number of smaller sampling windows. The circular edge detector 300 includes lead edge detector cells (EDC) 400 alternating with edge detector series (EDSs) 310 operably connected to form a circular data path through the circular edge detector 300. Each of the lead edge detector cells 400 has an EDC data input 402, an EDC configuration input 406, an EDC input 412, and an EDC output 414. Each of the edge detector series 310 has an EDS input 312 and an EDS output 314. The edge detector series 310 includes one or more EDS edge detector cells 320, with each of the EDS edge detector cells 320 having an EDS cell input 322 and an EDS cell output 324. The EDS edge detector cells 320 are connected in series between the EDS input 312 and the EDS output 314, with the EDS cell output 324 of one EDS edge detector cell 320 connected to the EDS cell input 322 of the next EDS edge detector cell 320. The EDS cell input 322 of the first EDS edge detector cell 320 in the series is the EDS input 312 and the EDS cell output 324 of the last EDS edge detector cell 320 in the series is the EDS output 314. Each of the lead edge detector cells 400 and each of the EDS edge detector cells 320 have one or more edge outputs providing an edge signal that can be read determine the timing of a data signal. The edge outputs have been omitted from FIG. 4 for clarity of illustration.

Each of the lead edge detector cells 400 can be a basic edge detector cell, a tied configuration edge detector cell, a single configuration edge detector cell, or a dual configuration edge detector cell as illustrated in FIGS. 2A, 2B, 2D, and 2E. The lead edge detector cells 400 can be a mixture of the various types as desired for a particular application. Referring to FIG. 4, each of the EDS edge detector cells 320 can be a basic edge detector cell, a tied configuration edge detector cell, an unconfigurable edge detector cell, a single configuration edge detector cell, or a dual configuration edge detector cell as illustrated in FIGS. 2A-2E. In one embodiment, a single EDS edge detector cell 320 can be used as the edge detector series 310. In another embodiment, a number of EDS edge detector cells 320 can be used as the edge detector series 310. In yet another embodiment, the EDS edge detector cells 320 can be a mixture of the various types as desired for a particular application. The unconfigurable edge detector cell, which reduces the number of logic gates used in the edge detector series 310, can be used when no data input or configuration input is needed for the EDS edge detector cell 320.

In operation, the circular edge detector 300 can be configured to use the whole length and provide a large sampling window or can be divided into shorter lengths and a number of smaller sampling windows. In one example, one of the lead edge detector cells 400 is connected to receive a data signal at its EDC data input 402 and the edge detector cell 400 is configured to block the previous cell signal at its EDC input 412. All of the lead edge detector cells 400 and the edge detector series 310 can be used to provide edge detection for the data signal. In another example, each of the lead edge detector cells 400 is connected to receive a data signal at its EDC data input 402 and each of the lead edge detector cells 400 is configured to block the previous cell signal at its EDC input 412. Each edge detector cell 400 and following edge detector series 310 can be used to provide edge detection for each of the data signals.

Those skilled in the art will appreciate that the components and configuration of the circular edge detector 300 can be selected as desired for a particular application.

Figure 5A:
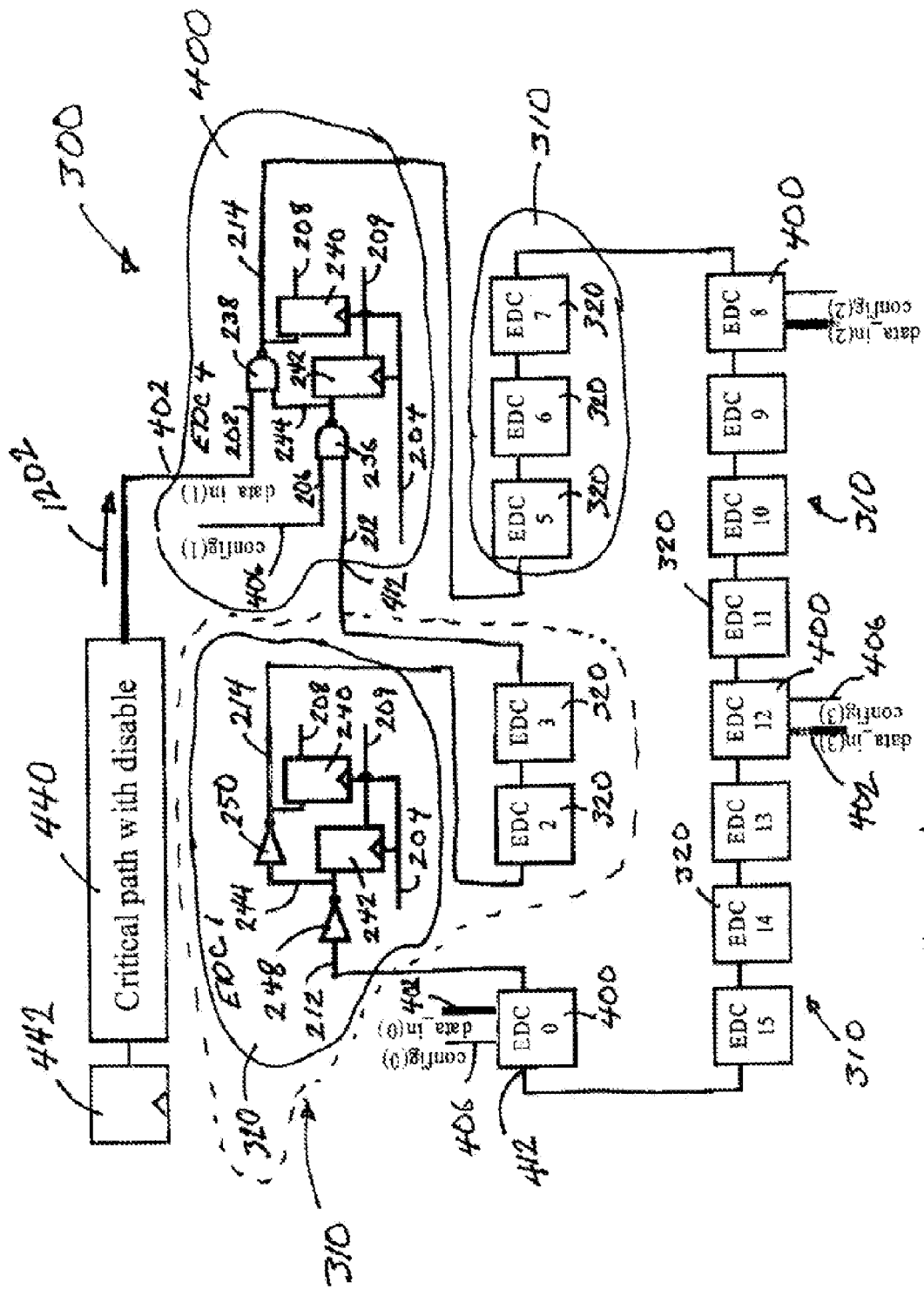
Figure 5B:
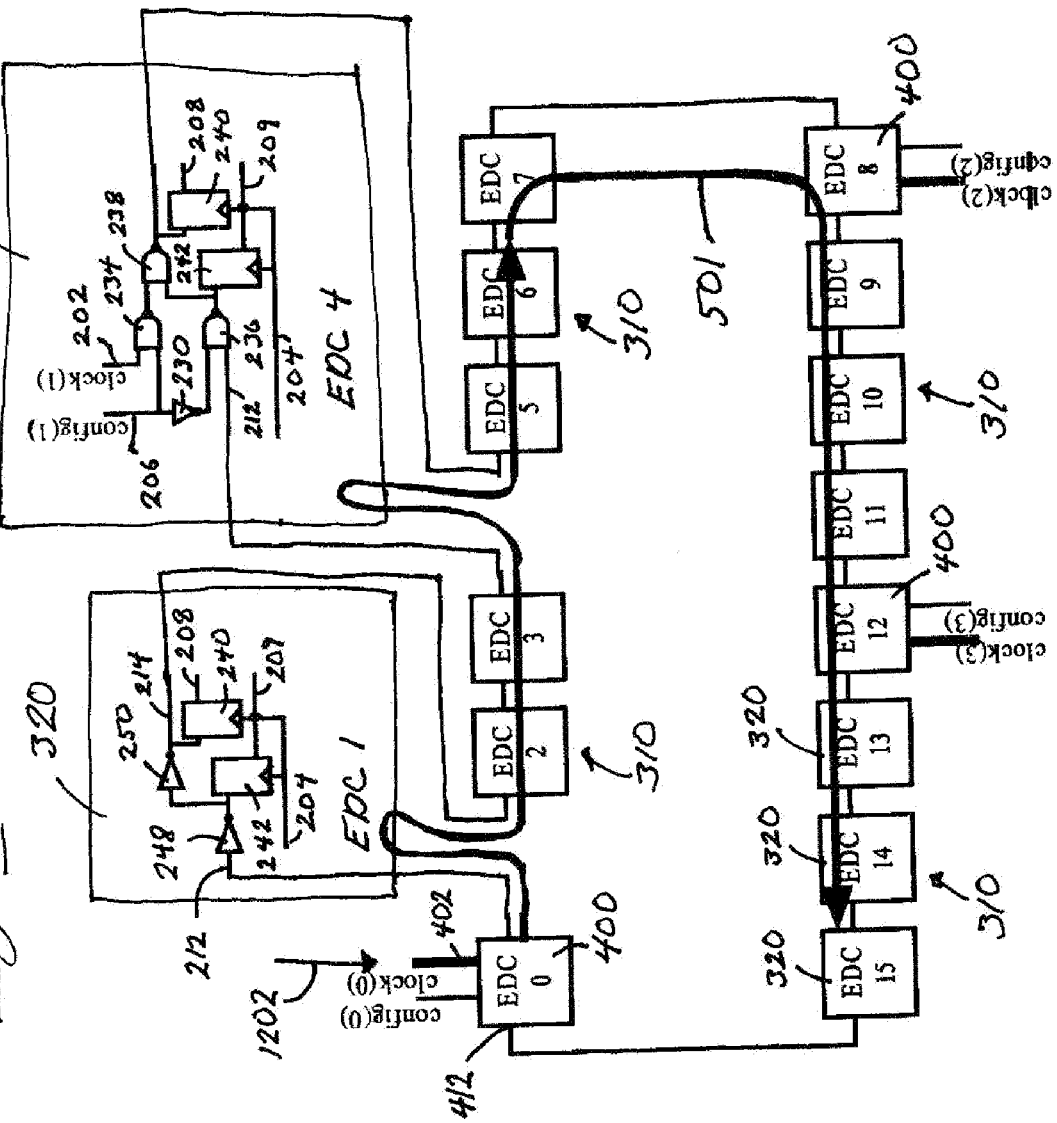

FIGS. 5A-5C are block diagrams of embodiments of circular edge detectors made in accordance with the present invention.

Referring to FIG. 5A, in which like elements share like reference numbers with FIGS. 2C, 2D, and 4, the circular edge detector 300 of this example is configured to provide edge detection for a datapath with disable control 440 launching from a flip-flop 442.

In this example, the zero, fourth, eight, and twelfth lead edge detector cells 400 (EDC0, EDC4, EDC8, EDC12) are single configuration edge detector cells and the EDS edge detector cells 320 in the edge detector series 310 (EDC1-EDC3, EDC5-EDC7, EDC9-EDC11, EDC13-EDC15) are unconfigurable edge detector cells. The detail of a single configuration edge detector cell is illustrated for lead edge detector cell EDC4 and the detail of an unconfigurable edge detector cell is illustrated for EDS edge detector cell EDC1. Edge detector cell EDC4 is connected to receive a data signal 1202 from the datapath 440 at its EDC data input 402 and is configured to block the previous cell signal 212 from the third EDS edge detector cell 320 (EDC3) at the EDC input 412 for EDC4. The use of a single configuration edge detector cell as lead edge detector cell EDC4 is possible since the datapath 440 can be put into a disable mode such that the data signal 1202 remains high, so that the circular configuration of the edge detector is not disturbed. The data signal 1202 is designed to be high in its normal state, so that the present cell signal 214 is a function of the previous cell signal 212 for EDC4. When the datapath disable flip-flop 442 switches so that the data signal 202 goes low, the present cell signal 214 is a function of the data signal 1202 for EDC4, and the configuration signal 206 is taken low to block the previous cell signal 212 for EDC4. All the lead edge detector cells 400 and the edge detector series 310 from EDC4 to EDC15 to EDC 0 to EDC3 can be used to provide edge detection for the data signal 202. A rotator (not shown) can be used to realign the edge signals from each of the edge detector cells so that the edge signal first captured by the circular edge detector is read first.

Referring to FIG. 5B, in which like elements share like reference numbers with FIGS. 2B, 2C, and 4, the circular edge detector 300 of this example is configured to provide edge detection for a clock provided as a data signal 1202, as can be used to determine clock skew, using a large sampling window.

In this example, the zero, fourth, eight, and twelfth lead edge detector cells 400 (EDC0, EDC4, EDC8, EDC12) are tied configuration edge detector cells and the EDS edge detector cells 320 in the edge detector series 310 (EDC1-EDC3, EDC5-EDC7, EDC9-EDC11, EDC13-EDC15) are unconfigurable edge detector cells. The detail of a tied configuration edge detector cell is illustrated for lead edge detector cell EDC4 and the detail of an unconfigurable edge detector cell is illustrated for EDS edge detector cell EDC1. Edge detector cell EDC0 is connected to receive a data signal 1202 from a clock at its EDC data input 402 and is configured to block the previous cell signal 212 for EDC0 from the fifteenth EDS edge detector cell 320 (EDC15) at the EDC input 412 for EDC0. When the configuration signal 206 for EDC0 is high, the present cell signal 214 follows the data signal 1202 and the previous cell signal 212 for EDC0 is blocked. All the lead edge detector cells 400 and edge detector series 310 from EDC0 to EDC15 can be used to provide edge detection for the data signal 1202, as indicated by the arrow 501.

Referring to FIG. 5C, in which like elements share like reference numbers with FIGS. 2C, 2E, and 4, the circular edge detector 300 of this example is configured to provide edge detection for multiple clocks provided as data signals 1202, 1203, 1204, 1205, as can be used to determine clock skews, using multiple smaller sampling windows.

In this example, the zero, fourth, eight, and twelfth lead edge detector cells 400 (EDC0, EDC4, EDC8, EDC12) are dual configuration edge detector cells and the EDS edge detector cells 320 in the edge detector series 310 (EDC1-EDC3, EDC5-EDC7, EDC9-EDC11, EDC13-EDC15) are unconfigurable edge detector cells. The detail of a dual configuration edge detector cell is illustrated for lead edge detector cell EDC4 and the detail of an unconfigurable edge detector cell is illustrated for EDS edge detector cell EDC1.

The lead edge detector cells 400 are connected to receive data signals 1202, 1203, 1204, 1205 from clocks at EDC data inputs 402: EDC0, EDC4, EDC8, and EDC12 are operably connected to different clocks under measurement. Each of the lead edge detector cells 400 is connected to receive a first configuration signal 206 that passes or blocks its data signal and a second configuration signal 252 that passes or blocks the previous cell signal 212. The lead edge detector cells 400 are configured to block the previous cell signal 212 from the previous EDS edge detector cell 320 at the EDC input 412: the first configuration signal 206 is set high and the second configuration signal 252 is set low. The lead edge detector cells 400 and the edge detector series 310 form one sampling window of four edge detector cells from EDC0 to EDC3 for data signal 1202 as indicated by arrow 502, one sampling window of four edge detector cells from EDC4 to EDC7 for data signal 1203 as indicated by arrow 503, one sampling window of four edge detector cells from EDC8 to EDC1 for data signal 1204 as indicated by arrow 504, and one sampling window of four edge detector cells from EDC12 to EDC15 for data signal 1205 as indicated by arrow 505.

Those skilled in the art will appreciate that the multiple sampling windows can be set for different lengths as desired for a particular application. In one example, the circular edge detector 300 of FIG. 5C can operate so that the multiple sampling windows include one sampling window of four edge detector cells from EDC0 to EDC3 for data signal 1202, one sampling window of four edge detector cells from EDC4 to EDC7 for data signal 1203, and one sampling window of eight edge detector cells from EDC8 to EDC15 for data signal 1204. In one embodiment, each single edge detector cell is a sampling window of one latch. The single edge detector cell embodiment can check the state of other state capturing elements, such as non-scannable latches or SRAM cells. In another embodiment, some of the edge detector series 310 can include different numbers of EDS edge detector cells 320, so that each of the sampling windows includes a different number of edge detector cells. Stringing together edge detector series 310 of different lengths within different sampling windows can results in multiple sampling windows of multiple different lengths. In yet another embodiment, the length of the sampling window can be changed dynamically so that the edge of the data signal loops through the circular data path more than once. The length of this virtual sampling window is greater than the number of edge detector cells in the circular data path through the circular edge detector. The configuration signals are set so that the previous cell signal is not blocked at the edge detector cell receiving the data signal. The edge signals indicating the state of the present cell signal can be read before being overwritten as the edge makes another pass through the circular data path.

Figure 6:
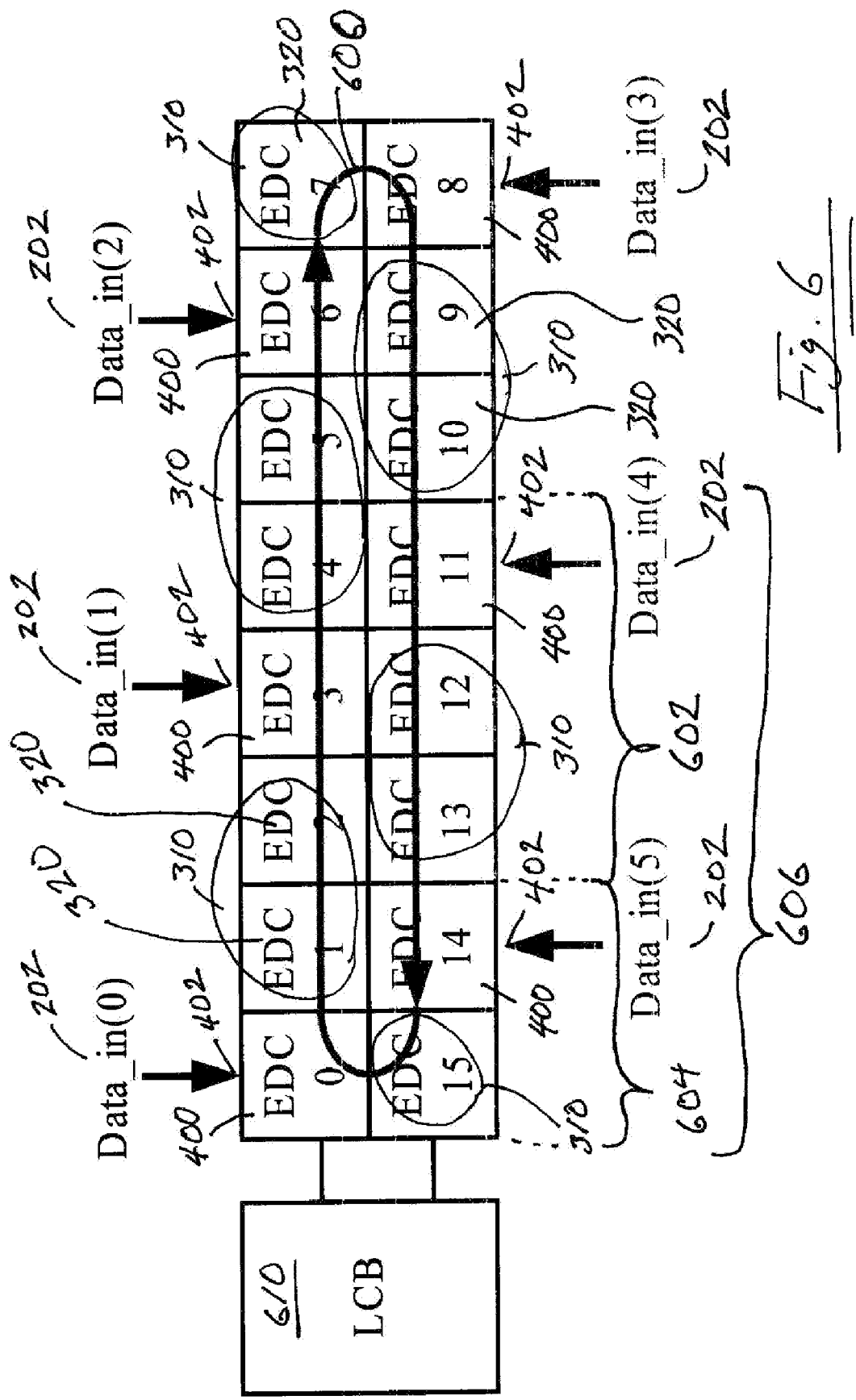
FIG. 6 is a schematic diagram of a layout for a circular edge detector made in accordance with the present invention.

FIG. 6, in which like elements share like reference numbers with FIG. 4, is a schematic diagram of a layout for a circular edge detector made in accordance with the present invention. The circular edge detector is laid out in a closely packed array with spaced apart data inputs to conserve space and reduce noise effects.

The circular edge detector 300 is laid out in a 2×8 array with edge detector cells (EDC) 400 alternating with edge detector series (EDSs) 310 operably connected to form a circular data path 600 through the circular edge detector 300. Local clock block (LCB) 610 is operably connected to the circular edge detector 300. Each of the lead edge detector cells 400 and EDS edge detector cells 320 forming the subsequent edge detector series 310 can be configured as a sampling window. In this example, the edge detector series 310 include different numbers of EDS edge detector cells 320, so the sampling windows can be configured with different lengths. Sampling window 602 from EDC11 to EDC13 includes three edge detector cells and sampling window 604 from EDC14 to EDC15 includes two edge detector cells. The sampling windows 602, 604 can be combined in another configuration, so that the sampling window 606 includes five edge detector cells from EDC11 to EDC15. Packing the edge detector cells in an array avoids long communication lines that can be susceptible to noise and signal delay. Separating the data inputs, such as separating the data inputs by at least one edge detector cell, avoids cross talk between data signals on the data inputs.

It is important to note that the figures and description illustrate specific applications and embodiments of the present invention, and is not intended to limit the scope of the present disclosure or claims to that which is presented therein. Upon reading the specification and reviewing the drawings hereof, it will become immediately obvious to those skilled in the art that myriad other embodiments of the present invention are possible, and that such embodiments are contemplated and fall within the scope of the presently claimed invention.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. A circular edge detector on an integrated circuit comprising:
    a plurality of edge detector cells, each of the plurality of edge detector cells having an input select block operable to receive a data signal and a previous cell signal and to generate a present cell signal, and a state capture block operably connected to receive the present cell signal;
    wherein the present cell signal of each of the plurality of edge detector cells is provided to a next of the plurality of edge detector cells as the previous cell signal for the next of the plurality of edge detector cells; and
    the present cell signal from a last edge detector cell is provided to a first edge detector cell as the previous cell signal for the first edge detector cell.

2. The detector of claim 1 wherein the state capture blocks are responsive to a clock signal to trigger the capture the present cell signal.

3. The detector of claim 1 wherein the edge detector cells are selected from the group consisting of a basic edge detector cell, a tied configuration edge detector cell, an unconfigurable edge detector cell, a single configuration edge detector cell, and a dual configuration edge detector cell.

4. An edge detection method with a variable length sampling window on an integrated circuit comprising:
    providing a circular edge detector having edge detector cells (EDCs), an EDC data output of each of the edge detector cells being operably connected to an EDC data input of another of the edge detector cells to form a circular data path through the circular edge detector; and
    configuring one of the edge detector cells to receive a data signal and to block the EDC data input through the one of the edge detector cells.

5. The method of claim 4 further comprising:
    receiving the data signal at the one of the edge detector cells;
    passing the data signal along the circular data path through the edge detector cells;
    blocking the data signal at the one of the edge detector cells; and
    capturing a state for the data signal at each of the edge detector cells at a predetermined time.

6. The method of claim 5 further comprising rotating the captured states to read the state at the one of the edge detector cells first.

7. The method of claim 4 further comprising configuring another one of the edge detector cells to receive a second data signal and to block the EDC data input through the another one of the edge detector cells.

8. The method of claim 7 further comprising:
    receiving the data signal at the one of the edge detector cells;
    receiving the second data signal at the another one of the edge detector cells;
    passing the data signal and the second data signal along the circular data path through the edge detector cells;
    blocking the data signal at the another one of the edge detector cells;
    blocking the second data signal at the one of the edge detector cells; and
    capturing a state for the data signal and the second data signal at each of the edge detector cells at a predetermined time.

9. A circular edge detector on an integrated circuit comprising:
    input select blocks, each of the input select blocks being operable to receive a data signal and a previous cell signal, an input select block output of each of the input select blocks being operably connected to an input select block input of another of the input select blocks to form a circular data path; and
    state capture blocks, operably connected to the input select block output of each of the input select blocks;
    wherein at least one of the input select blocks is configurable to divide the circular data path into a sampling window.

10. The detector of claim 9 wherein at least two of the input select blocks are configurable to divide the circular data path into a first sampling window and a second sampling window.

11. The detector of claim 10 wherein the first sampling window and the second sampling window are of different lengths.

* * * * *